US 6,801,826 B2

(12) United States Patent
Tanabe

(10) Patent No.: US 6,801,826 B2
(45) Date of Patent: Oct. 5, 2004

(54) SYSTEM AND METHOD FOR MANUFACTURING SEMICONDUCTOR DEVICES CONTROLLED BY CUSTOMER

(75) Inventor: Hiroshi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 35 days.

(21) Appl. No.: 10/202,045

(22) Filed: Jul. 25, 2002

(65) Prior Publication Data
US 2003/0036971 A1 Feb. 20, 2003

(30) Foreign Application Priority Data
Aug. 16, 2001 (JP) ........................................ 2001-247238

(51) Int. Cl.⁷ .............................................. G06F 19/00
(52) U.S. Cl. .......................... 700/121; 700/96; 705/26; 716/1
(58) Field of Search ........................... 700/96, 97, 101, 700/102, 121; 705/26; 716/1

(56) References Cited

U.S. PATENT DOCUMENTS

| | | | | |
|---|---|---|---|---|
| 5,294,811 A | * | 3/1994 | Aoyama et al. | 257/59 |
| 6,265,290 B1 | * | 7/2001 | Moon et al. | 438/505 |
| 6,578,174 B2 | * | 6/2003 | Zizzo | 716/1 |
| 2001/0044667 A1 | * | 11/2001 | Nakano et al. | 700/100 |
| 2001/0051886 A1 | * | 12/2001 | Mitsutake et al. | 705/7 |
| 2002/0107813 A1 | * | 8/2002 | Kanatani et al. | 705/64 |
| 2002/0111708 A1 | * | 8/2002 | Nakano | 700/121 |
| 2002/0123818 A1 | * | 9/2002 | Yamada et al. | 700/121 |
| 2002/0143656 A1 | * | 10/2002 | Matsuo et al. | 705/26 |
| 2003/0055736 A1 | * | 3/2003 | Eldridge et al. | 705/26 |
| 2003/0208448 A1 | * | 11/2003 | Perry et al. | 705/64 |

FOREIGN PATENT DOCUMENTS

| | | | |
|---|---|---|---|
| JP | 6-268043 | 9/1994 | |
| JP | 6-268067 | 9/1994 | |
| JP | 9-180980 | 7/1997 | |
| JP | 10-247616 | 9/1998 | |
| JP | 11-219875 | 8/1999 | |
| JP | 2002260977 A | * 9/2002 | ........... H01L/21/02 |

* cited by examiner

Primary Examiner—Paul Rodriguez
(74) Attorney, Agent, or Firm—Young & Thompson

(57) ABSTRACT

In a system for manufacturing semiconductor devices, a customer information management apparatus is connected via a network to a plurality of customer terminals to receive orders from the customer terminals. A manufacturing management apparatus is connected between the customer information management apparatus and processing units and inspection units to control the processing units and the inspection units in accordance with the orders in the customer information management apparatus. Each of the orders includes a designated quantity of lots, a designated substrate, designated processing units, designated recipes thereof, designated inspection units and designated inspection recipes thereof.

17 Claims, 17 Drawing Sheets

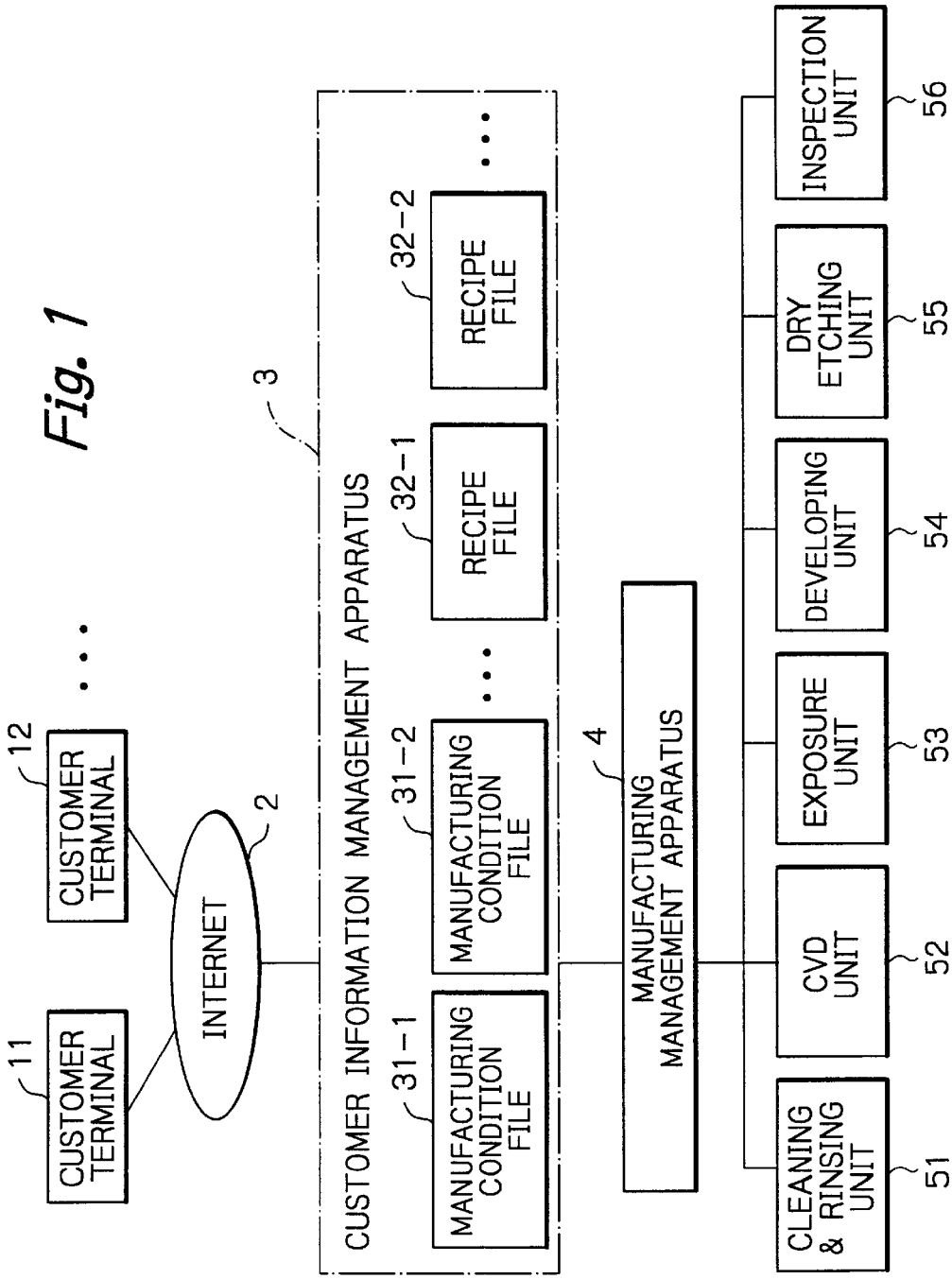

Fig. 2

```
CUSTOMER 1
QUANTITY : 500 (50 WAFERS/LOT ×10 LOTS)
SUBSTRATE : MADE BY COMPANY N, GRADE A, SIZE (400 × 500 × 0.7mm)
PROCESS SPEC.
  1) CLEANING : CLEANING & RINSING UNIT, RECIPE 3
  2) DEPOSITING OF SiO₂ : CVD UNIT, RECIPE 3
  3) EXPOSING : EXPOSURE UNIT, MASK 2
  4) DEVELOPING : DEVELOPING UNIT, RECIPE 10
  5) ETCHING : DRY ETCHING UNIT, RECIPE 1
  6) ……
  7) ……

INSPECTION SPEC.
  1) THICKNESS : XX±XX
  2) RESISTIVITY : XX±XX
  3) DEPTH : XX±XX
DESIRED TIME FOR DELIVERY : XX. XX. 2002
```

```
                                32-1
┌─────────────────────────┐
│ RECIPE                  │
│   1:     1 %HF          │
│   2:     H₂SO₄/H₂O₂     │
│   3:     HCl/H₂O₂       │
│   4:     NH₃OH/H₂O₂     │
│   5:     PURE WATER     │
└─────────────────────────┘
```

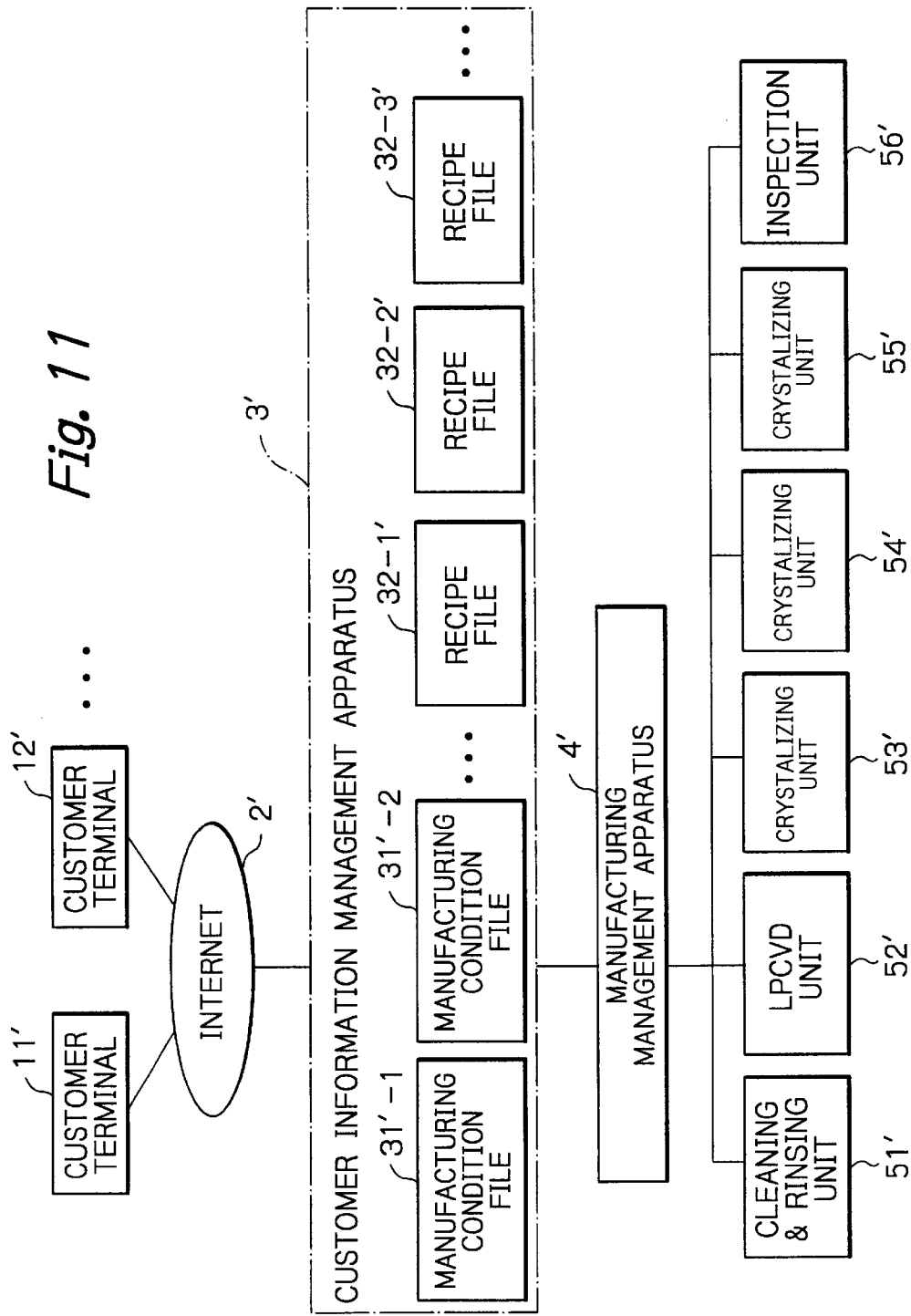

Fig. 12

CUSTOMER 1
QUANTITY : 500 (50 GLASS SUBSTRATES/LOT ×10 LOTS)
SUBSTRATE : MADE BY COMPANY N, GRADE A, SIZE (400 × 500 × 0.7mm)
PROCESS SPEC.
1) CLEANING : CLEANING & RINSING UNIT, RECIPE 3
2) DEPOSITING OF $SiO_2$ : LPCVD UNIT, RECIPE 3
3) DEPOSITING OF a-Si : LPCVD UNIT, RECIPE 4
4) IRRADIATING WITH LASER : CRYSTALIZING UNIT 53', RECIPE 2
5) ......
6) ......
7) ......

INSPECTION SPEC.
1) THICKNESS : XX±XX
2) DEVIATION OF LASER IRRADIATION : XX±XX
DESIRED TIME FOR DELIVERY : XX.XX.2002

31'-1

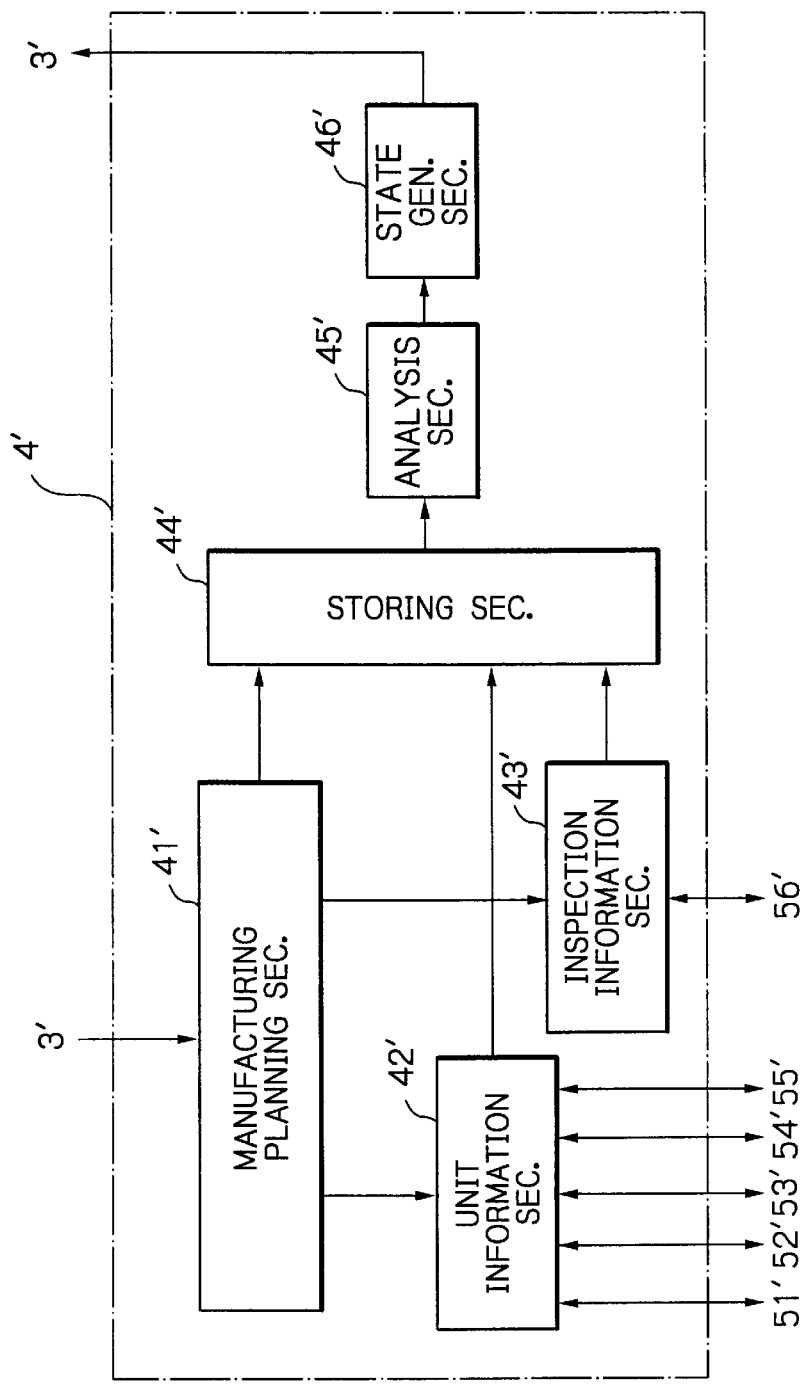

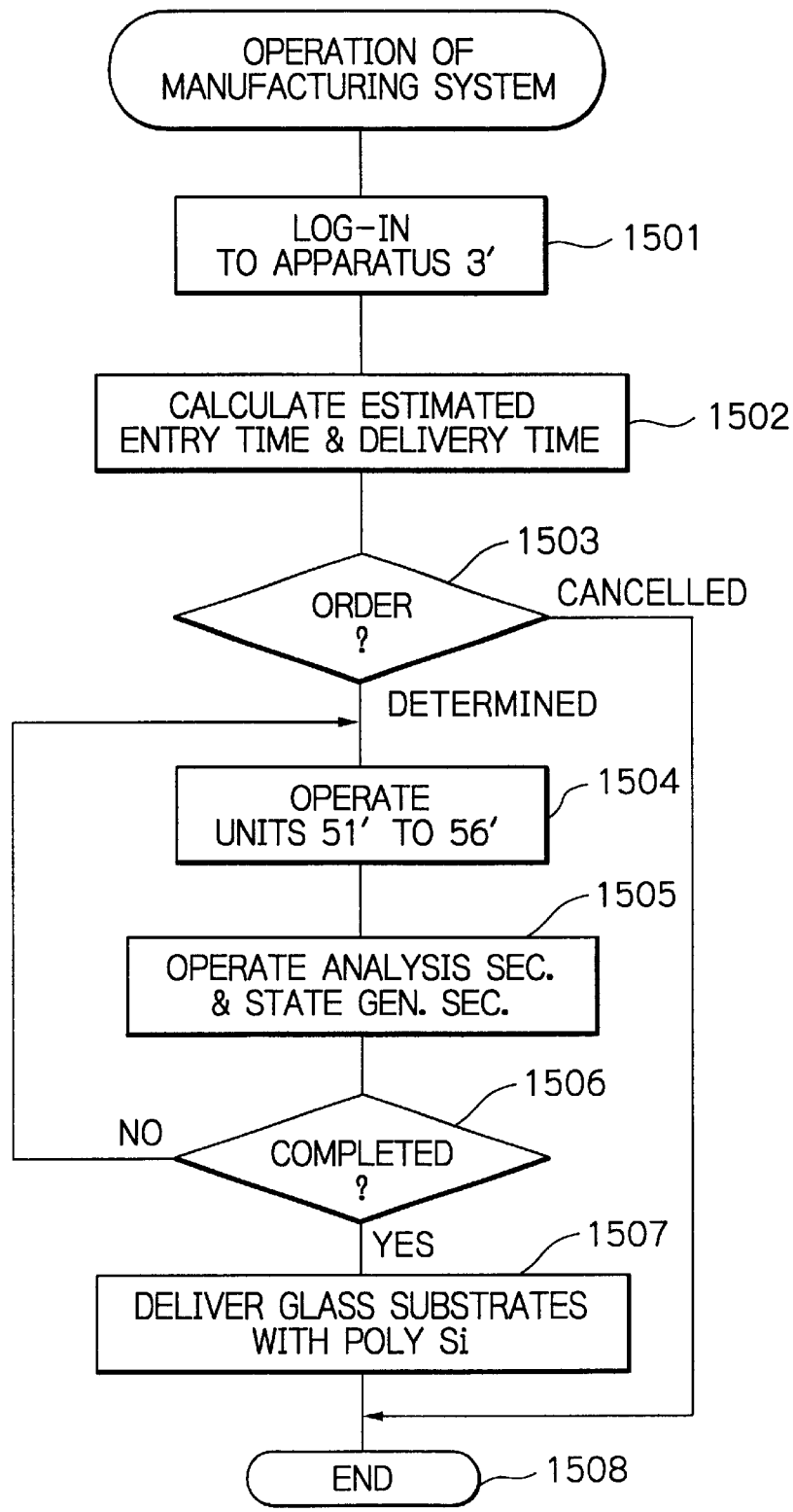

SYSTEM AND METHOD FOR MANUFACTURING SEMICONDUCTOR DEVICES CONTROLLED BY CUSTOMER

BACKGROUD OF THE INVENTION

1. Field of the Invention

The present invention relates to a system and method for manufacturing semiconductor devices including liquid crystal display (LCD) panels.

2. Description of the Related Art

Computer systems have been introduced to enhance the efficiency of manufacturing semiconductor devices.

In a first prior art semiconductor device manufacturing system (see: JP-A-6-268043), first input/output terminals each for controlling one reticle shelf and second input/output terminals each for controlling one process are connected to a host computer. In this case, at least one exposing process is included. Upon receipt of a start message or an end message from each of the second input/output terminals, the host computer determines whether or not a lot will arrive at an exposing unit for the exposing process. If it is determined that the lot will arrive at the exposing unit, the host computer predicts an arrival timing of the lot at the exposing unit and transmits a reticle outgoing message to a respective one of the first input/output terminals. As a result, a reticle is delivered to the exposing unit before the arrival timing of the lot, thus which would decrease an idle time of the exposing unit, thus enhancing the manufacturing effect.

In the above-described semiconductor device manufacturing system, however, since customers cannot directly control the manufacturing process of semiconductor device manufacturers, the manufacturing efficiency is low.

In a second prior art semiconductor device manufacturing system (see: JP-A-6-268067), a customer (LSI designer) has a computer-aided design (CAD) apparatus which is connected via a communication line to a database of a semiconductor device manufacturer. As a result, the customer accesses the database of the semiconductor device manufacturer via the communication line, so that accessed actual circuit data is converted into a data library in the CAD apparatus. Thus, the customer can design an LSI by using the data library.

Even in the above-described second prior art semiconductor device manufacturing system, however, since the customer cannot directly control the manufacturing process of semiconductor device manufacturers, the manufacturing efficiency is still low.

In a third prior art semiconductor device manufacturing system (see: JP-A 9-180980), CAD information for each customer is input from a first input terminal to a CAD center, while order information from each customer is input from a second input terminal to a production management center. The CAD center and the production management center are connected to a transmission center which selects an optimum one of semiconductor device manufacturing lines via communication lines in accordance with the CAD information and the order information.

Even in the above-described third prior art semiconductor device manufacturing system, however, since customers cannot directly control the manufacturing process of semiconductor device manufacturers, the manufacturing efficiency is still low.

In a fourth prior art semiconductor device manufacturing system (see: JP-A10-247616), a plurality of exposure units each storing predetermined specific exposure jobs are connected by a communication line. In a first one of the exposure units, if there is no job to be carried out, the first exposure unit transmits an inquiry to a second one of the exposure units to determine whether or not such a job is stored therein. If stored, an exposure process is carried out in the first exposure unit by using the job stored in the second exposure unit. Thus, the amount of jobs stored in the exposure units can be decreased.

Even in the above-described fourth prior art semiconductor device manufacturing system, however, since customer cannot directly control the manufacturing process of semiconductor device manufacturers, the manufacturing efficiency is still low.

In a fifth prior art semiconductor device manufacturing system (see: JP-A-11-219875), a hierarchy structure is constructed by a plurality of main frame controllers each for controlling a semiconductor device manufacturing line and a host computer for controlling the main frame controllers, thus effectively scheduling semiconductor device manufacturing lines.

Even in the above-described fifth semiconductor device manufacturing system, however, since customers cannot directly control the manufacturing process of semiconductor device manufacturers, the manufacturing efficiency is still low.

Generally, standardized silicon wafers or standardized glass substrates are supplied from wafer manufacturers or glass manufacturers to semiconductor device manufacturers or LCD panel manufacturers. However, in order to meet the requirements of customized products, various specifications are required for substrates. For example, a silicon-on-insulator (SOI) substrate or a plastic substrate is adopted. Additionally, various specifications are required for the thickness of silicon oxide and semiconductor formed on an SOI substrate. Particularly, as LCD panels have recently adopted system-on-glass technology, a high-quality silicon layer equivalent to monocrystalline silicon is deposited on a glass substrate or a plastic substrate. Further, customers may request change in the specification for every lot, every wafer or every glass or plastic substrate.

SUMMARY OF THE INVENTION

It is an object of the present invention to provide a system and method for manufacturing semiconductor devices including LCD panels where customers can directly control the manufacturing process of semiconductor device manufacturers and LCD panel manufacturers.

According to the present invention, in a system for manufacturing semiconductor devices, a customer information management apparatus is connected via a network to a plurality of customer terminals to receive orders from the customer terminals. A manufacturing management apparatus is connected between the customer information management apparatus and processing units and inspection units to control the processing units and the inspection units in accordance with the orders in the customer information management apparatus. Each of the orders includes a designated quantity of lots, a designated substrate, designated processing units, designated recipes thereof, designated inspection units and designated inspection recipes thereof.

BRIEF DESCRIPTION OF THE DRAWINGS

The present invention will be more clearly understood from the description set forth below, with reference to the accompanying drawings, wherein:

FIG. 1 is a block circuit diagram illustrating a first embodiment of the system for manufacturing a semiconductor device according to the present invention;

FIG. 2 is a diagram illustrating an example of the content of the manufacturing conduction file of FIG. 1;

FIG. 3 is a diagram illustrating an example of the recipe of FIG. 2;

FIG. 11 is a block circuit diagram illustrating a second embodiment of the system for manufacturing a semiconductor device according to the present invention;

FIG. 12 is a diagram illustrating an example of the content of the manufacturing conduction file of FIG. 11;

FIG. 14 is a detailed block circuit diagram of the manufacturing management apparatus of FIG. 11; and FIG. 15 is a flowchart for explaining the operation of the manufacturing system of FIG. 11.

DESCRIPTION OF THE PREFERRED EMBODIMENTS

Figure 4:
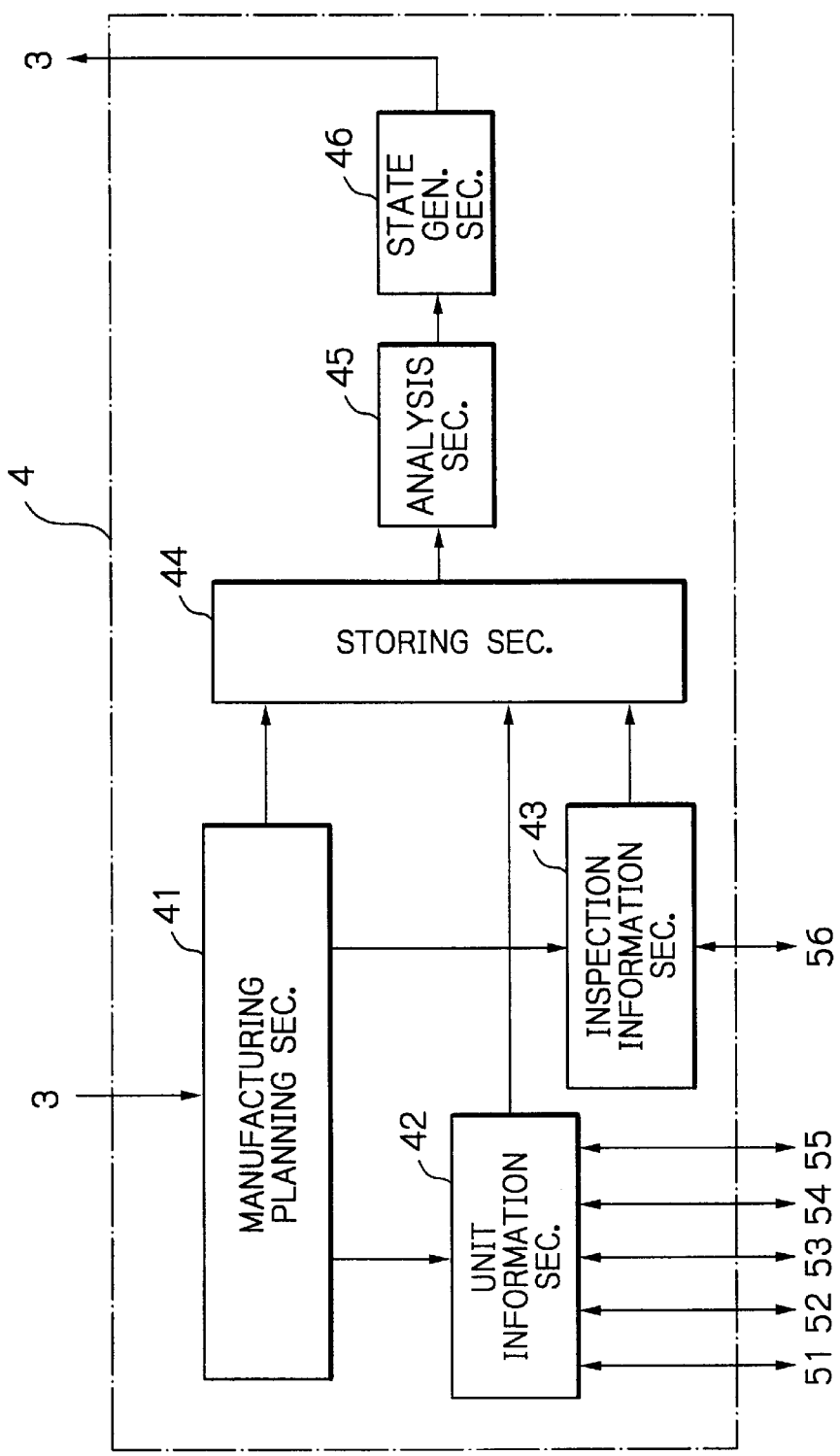
FIG. 4 is a detailed block circuit diagram of the manufacturing management apparatus of FIG. 1.

In FIG. 1, which illustrates a first embodiment of the present invention, reference numerals 11, 12, . . . designate customer terminals which are connected via the Internet 2 to a customer information management apparatus 3.

The customer information management apparatus 3 is constructed by a plurality of manufacturing condition files 31-1, 31-2, . . . each corresponding to one of the customer terminals 11, 12, . . . , and recipe files 32-1, 32-2, . . . . The customer information management apparatus 3 is connected via a communication line to a manufacturing management apparatus 4, which will be explained later in detail.

The manufacturing management apparatus 4 is connected via a communication line to processing units such as a cleaning and rinsing unit 51, a chemical vapor deposition (CVD) unit 52, an exposure unit 53, a developing unit 54, a dry etching unit 55 and an inspection unit 56.

In FIG. 2, which illustrates an example of the manufacturing condition file 31-1 of FIG. 1, the quantity, substrate, process specification and inspection specification for customer 1 are stored. Also, recipes of the process specification of FIG. 2 are stored in advance in the recipe files 32-1, 32-2, . . . , which correspond to the cleaning and rinsing process, the CVD process, . . . , respectively. An example of the recipe of the cleaning and rinsing process of FIG. 2 is illustrated in FIG. 3. Further, a desired time for delivery is stored.

In FIG. 4, which is a detailed block circuit diagram of the manufacturing management apparatus 4 of FIG. 1, the manufacturing management apparatus 4 is constructed by a manufacturing planning section 41 for planning manufacturing of the semiconductor devices, a unit information section 42 for controlling the units 51, 52, . . . , 55, an inspection information section 43 for controlling the unit 56, a storing section 44 for storing information from the manufacturing planning section 41, the unit information section 42 and the inspection information section 43, an analysis section 45 for analyzing the content of the storing section 44, and a state generating section 45 for generating the manufacturing state of the semiconductor devices in accordance with the analysis result of the analysis section 45.

The manufacturing planning section 41 receives the content of the manufacturing condition files 31-1, 31-2, . . . , i.e., the name of lots, the designated process unit and the designated inspection units of the manufactured semiconductor devices, to make a manufacturing plan. For example, an estimated time for entry and an estimated time for delivery are calculated.

The unit information section 42 receives the name of lots and the designated processing units including the inspection unit from the manufacturing planing section 41, to generate the start time and end time of each of the processing units for the lots. The unit information section 42 is connected to the processing units 51, 52, . . . , 55.

The inspection information section 43 receives the name of lots, the designated inspection units and the inspection specification from the manufacturing planning section 41, to generate the inspection result. The inspection information section 43 is connected to the inspection unit 56.

The start time and end time of each processing unit and the inspection result as well as the name of lots are stored in the storing section 44.

The operation of the manufacturing system of FIG. 1 is explained next with reference to FIG. 5.

First, at step 501, a customer is logged-in by using an identification (ID) number and a password to the customer information management apparatus 3. For example, the customer terminal 11 is connected via the Internet 2 to the customer information management apparatus 3. Then, the customer reads its manufacturing condition file 31-1 and edits the content thereof with reference to the recipe files 32-1, 32-2, . . . , thus preparing an order. Note that, as occasion demands, a desired time for delivery can be written into the manufacturing condition file 31-1.

Next, at step 502, the manufacturing planning section 41 calculates an estimated time for entry and an estimated time for delivery in accordance with the current state of the units 51 to 56. The estimated entry time and delivery time are stored in the storing section 44, and then, are transmitted by the analysis section 45 and the state generating section 46 to the customer terminal 11.

Next, at step 503, the customer decides whether the prepared order is to be proceeded with or to be cancelled. If the prepared order is to be proceeded with, the control proceeds to step 504. On the other hand, if the prepared order is to be cancelled, the control proceeds directly to step 508.

At step 504, the unit information section 42 operates the units 51 to 55, and also, the inspection information section 43 operates the unit 56. As a result, the start time and end time of each of the units 51 to 55 are transmitted from the unit information section 42 to the storing section 44, and also, the inspection result, such as the thickness, the resistively or the depth is transmitted from the inspection information section 43 to the storing section 44.

Next, at step 505, the analysis section 45 and the state generating section 46 are operated. That is, the analysis section 45 compares the start time and end time of each of the units 51 to 55 and the inspection result of the unit 56 with predetermined values supplied from the manufacturing planning section 41, to generate the manufacturing state of the semiconductor devices, which is transmitted to the customer terminal 11. If the estimated time for delivery is too delayed, a revised time for delivery is transmitted to the customer terminal 11. Also, in this case, an alarm signal is transmitted to the customer terminal 11.

Step 506 repeats the control at steps 504 and 505 until the semiconductor devices are completed.

At step 507, the completed semiconductor devices are delivered to the customer, which is also informed to the customer terminal 11.

Figure 5:
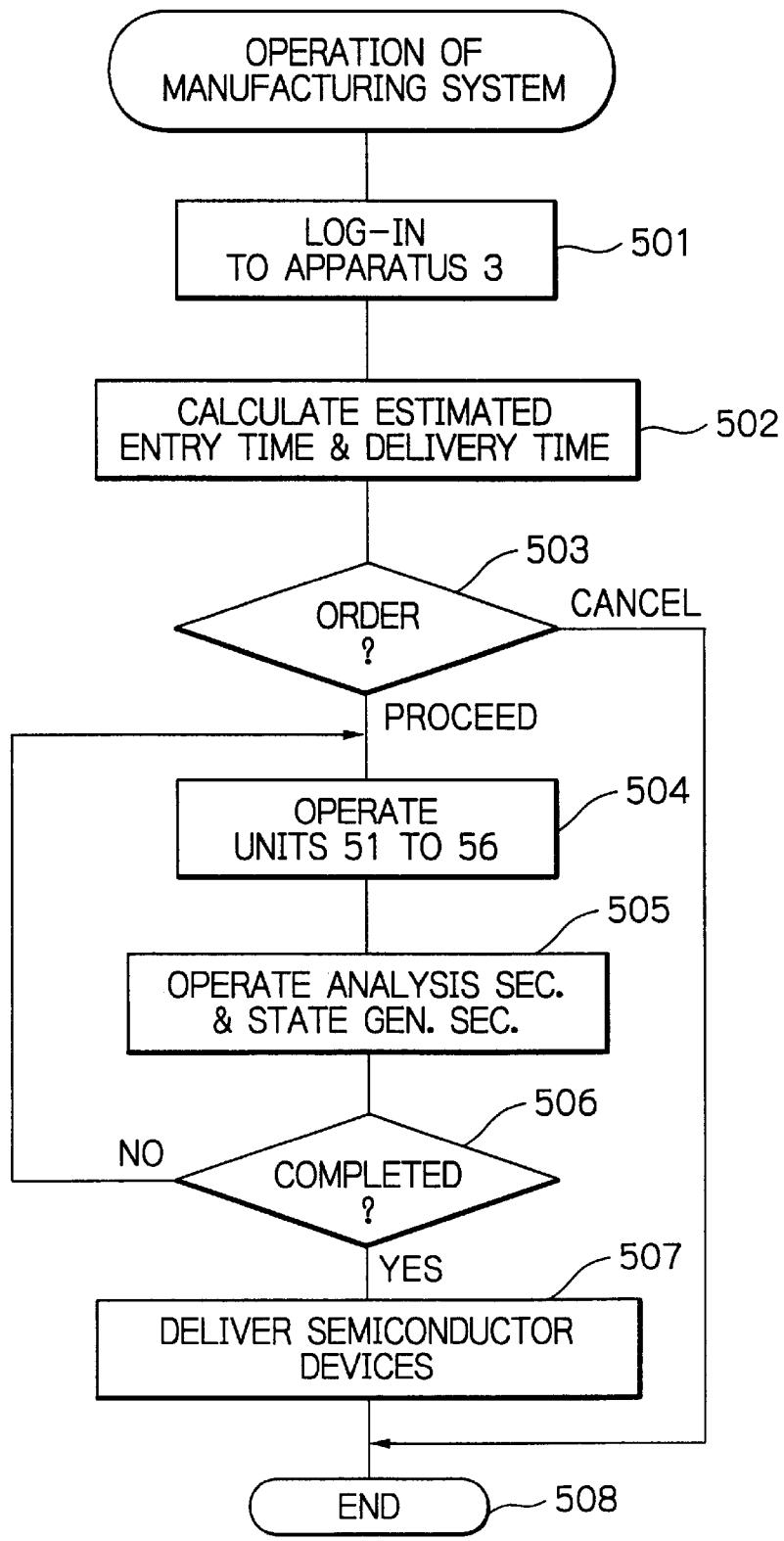
FIG. 5 is a flowchart for explaining the operation of the manufacturing system of FIG. 1.

Thus, the operation of FIG. 5 is completed by step 508.

The present invention is applied to a system for forming a polycrystalline silicon layer on a glass substrate, which is explained below with reference to FIGS. 6A, 6B, 7A, 7B, 8A, 8B, 9A, 9B, 10A and 10B. Note that FIGS. 6A, 7A, 8A, 9A and 10A are cross-sectional views taken along the line A—A of FIGS. 6B, 7B, 8B, 9B and 10B, respectively. The formation of this polycrystalline silicon layer is disclosed in the specification of U.S. Ser. No. 09/988,962 filed on Nov. 19, 2001.

Figure 6A:
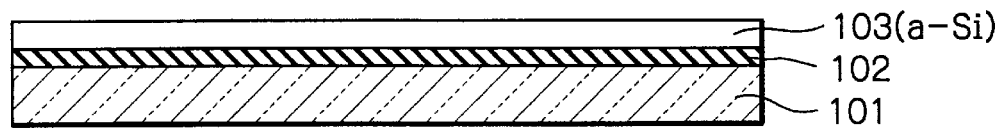
FIGS. 6A, 7A, 8A, 9A and 10A are cross-sectional views for explaining a method for forming a polycrystalline silicon layer on a glass substrate.
Figure 6B:
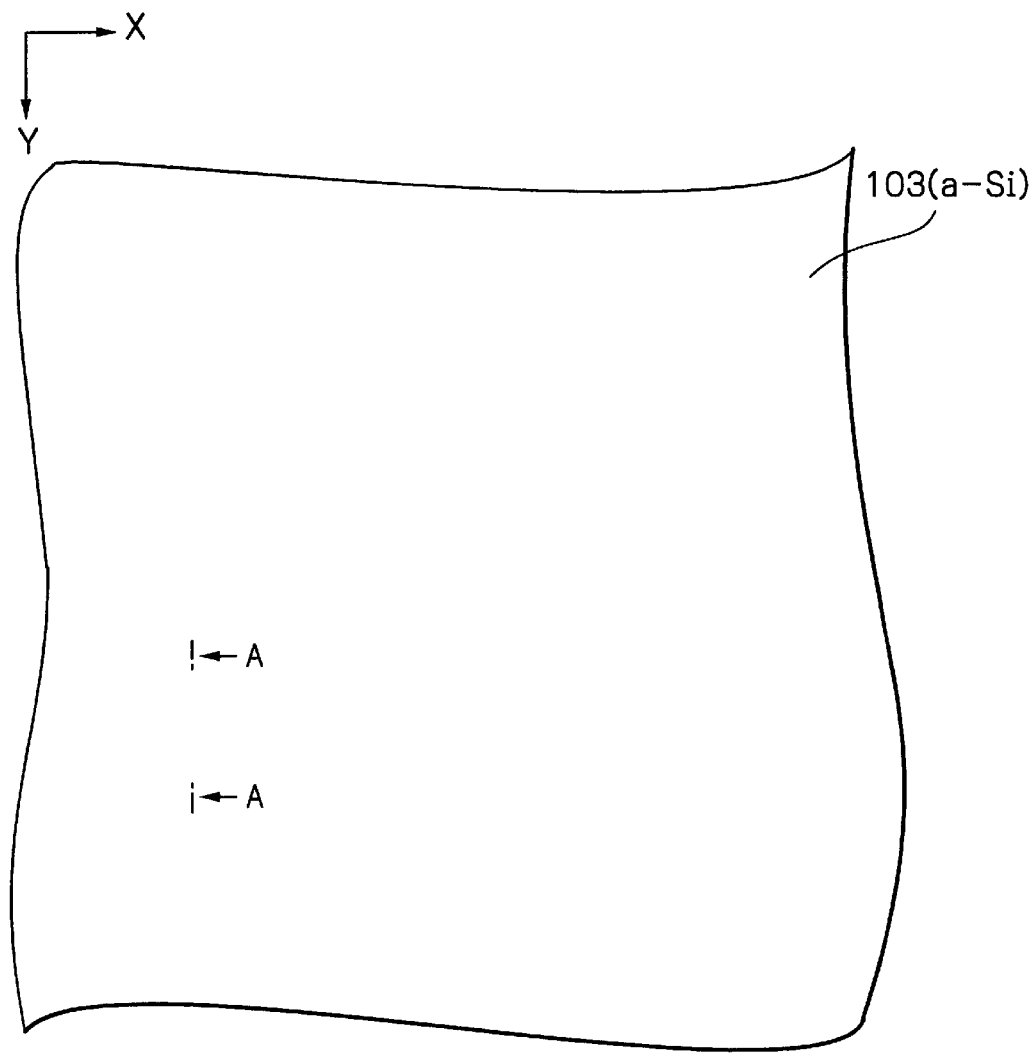
FIGS. 6B, 7B, 8B, 9B and 10B are plan views taken along the line A—A of FIGS. 6A, 7A, 8A, 9A and 10A, respectively.

First, referring to FIGS. 6A and 6B, an about 0.5 to 1.1 mm thick glass substrate 101 is subject to a cleaning and rinsing process to remove contaminants from the surface of the glass substrate 101. Then, in order to prevent harmful impurities from diffusing from the glass substrate 101, an about 1 $\mu$m thick substrate covering layer 102 made of silicon oxide is deposited on the glass substrate 101 by a low pressure CVD (LPCVD) process using silane gas and oxygen gas. Then, an about 60 to 80 nm thick amorphous silicon layer 103 is deposited on the substrate covering layer 102 by an LPCVD process using disilane gas at a temperature of about 500° C. In this case, the hydrogen concentration of the amorphous silicon layer 103 is less than 1 atom percent to prevent the emission of hydrogen atoms from the amorphous silicon layer 103 by a laser irradiation process which will be carried out later. If a large number of hydrogen atoms are emitted from the amorphous silicon layer 103, the surface of a polycrystalline silicon layer converted therefrom greatly fluctuates.

Figure 7A:
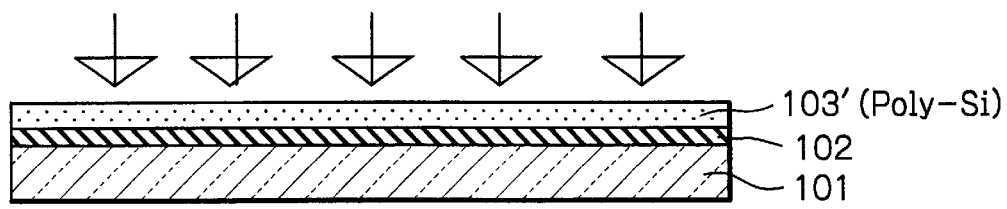
Figure 7B:
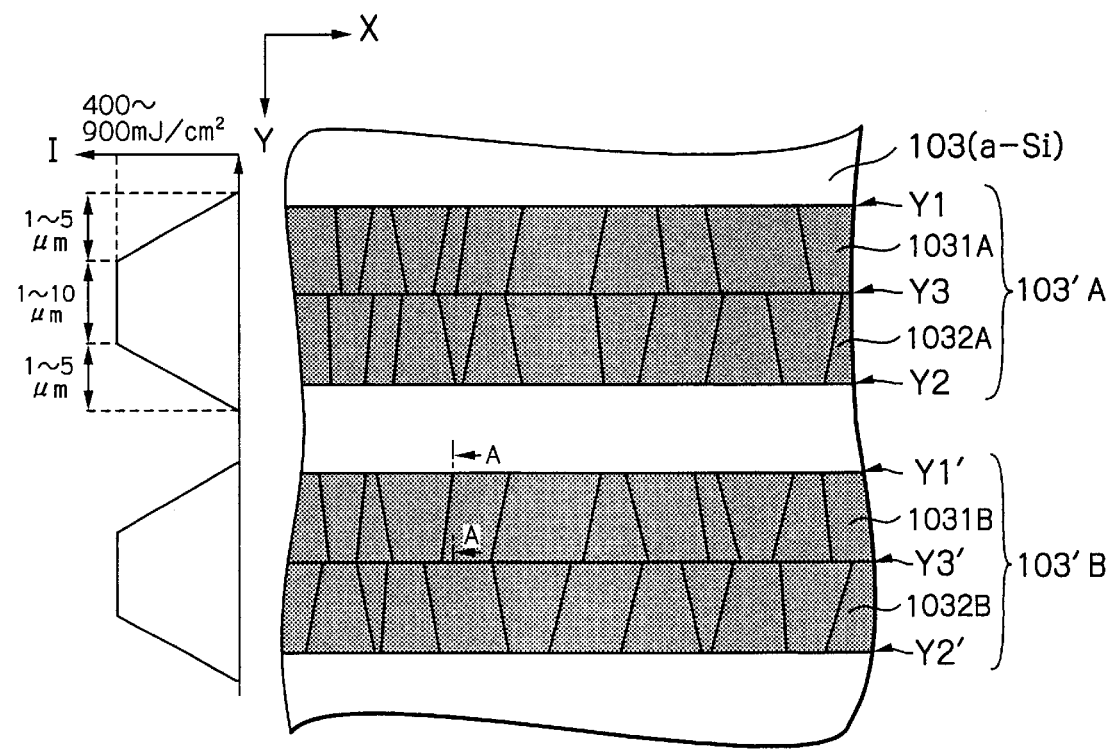

Next, referring to FIGS. 7A and 7B, the glass substrate 101 is again subject to a cleaning and rinsing process to remove contaminants from the surface of the amorphous silicon layer 103. Then, the glass substrate 101 is entered into a step and repetitive pulse laser apparatus where the amorphous silicon layer 103 is irradiated with laser line beams under an atmosphere of pure nitrogen gas at about 700 Torr ($8.33 \times 10^4$ Pa). In this case, the laser line beams have a rectangular size of 5 $\mu$m×100 $\mu$m. Also, the energy of the laser beams is relatively high, for example, about 400 to 900 mJ/am$^2$, and also, the slope of the energy with respect to the Y-direction is relatively sharp. As a result, as illustrated in FIG. 7B, crystalline silicon seeds (not shown) are randomly generated at portions of the amorphous silicon layer 103 at Y=Y1, Y2, Y1' and Y2' where the temperature is close to a melting point of silicon. Then, polycrystalline silicon is grown from the crystalline silicon seeds toward the center of each of the laser line beams at Y=Y3 and Y3'. Finally, the growth of polycrystalline silicon stops at Y=Y3 and Y3'. Thus, polycrystalline silicon layer 103'A and 103'B are obtained to include elongated grains having a length of approximately half of the width of the laser line beams. As a result, the polycrystalline silicon layer 103'A (103'B) has stripes each of which is divided into two regions 1031A and 1032A (1031B and 1032B). Then, nitrogen is exhausted from the pulse laser apparatus, and then, oxygen gas is introduced there into.

Note that the manufacturing conditions for the polycrystalline silicon layers 103'A and 103'B can be different from each other.

Figure 8A:
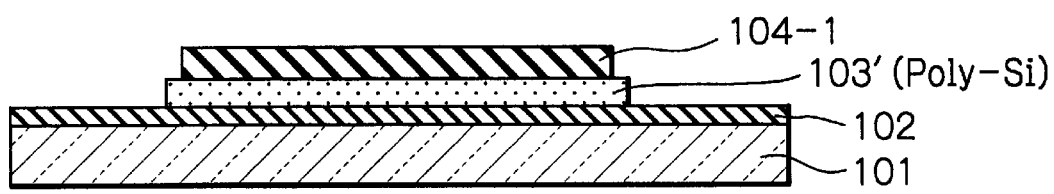
Figure 8B:
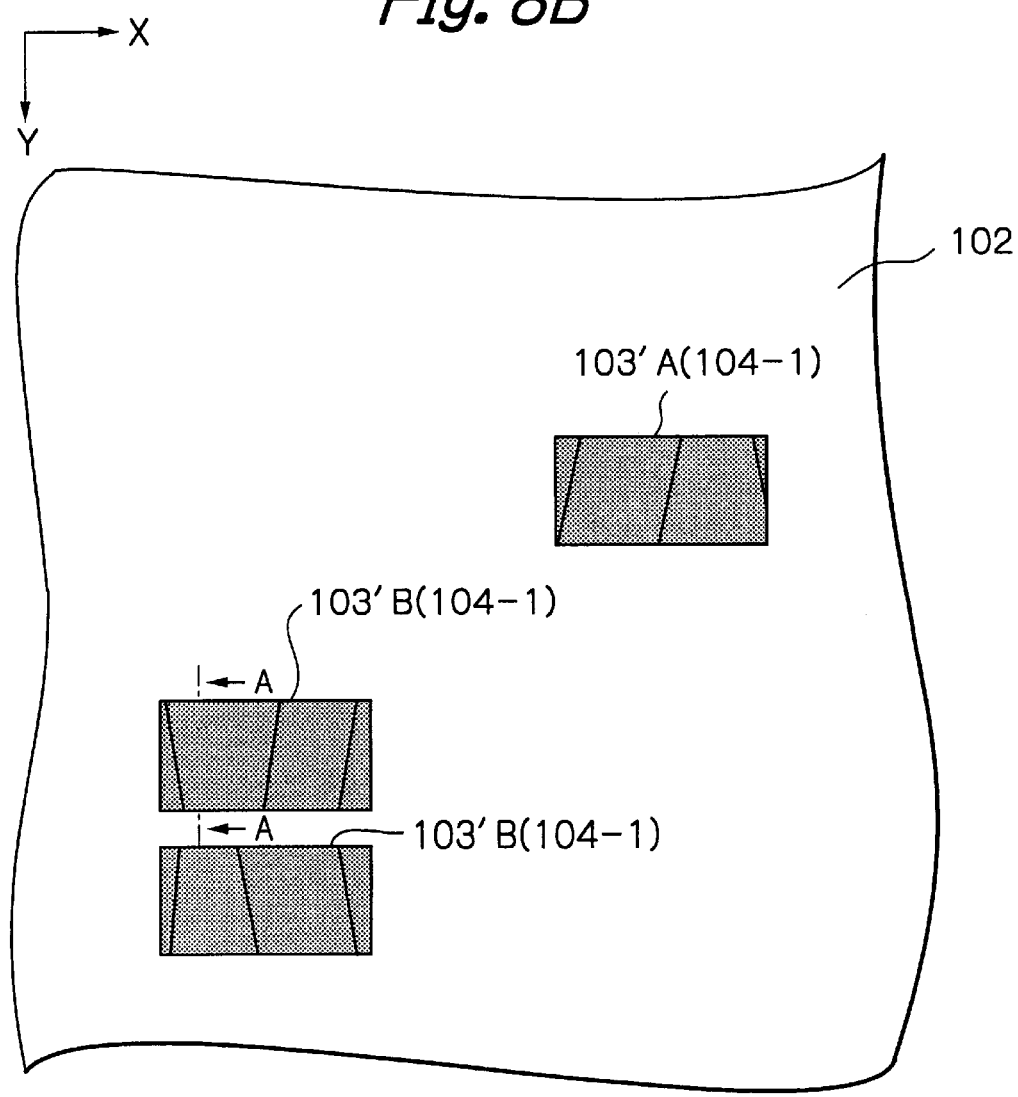

Next, referring to FIGS. 8A and 8B, an about 10 nm thick gate insulating layer 104-1 made of silicon oxide is deposited on the entire surface by a plasma CVD process using silane gas, helium gas and oxygen gas at a temperature of about 350° C. Thereafter, as occasion demands, a hydrogen plasma process and an annealing process are carried out. Then, the gate insulating layer 104-1 and the polycrystalline silicon layer 103'A and 103'B are patterned by a photolithography and etching process, so that islands formed by the gate insulating layer 104-1 and the polycrystalline silicon layer 103'A and 103'B are formed. In this case, the sides of the islands (103'A, 103'B, 104-1) are tapered to suppress gate leakage currents. However, the gate insulating layer 104-1 can be deleted.

Figure 9A:
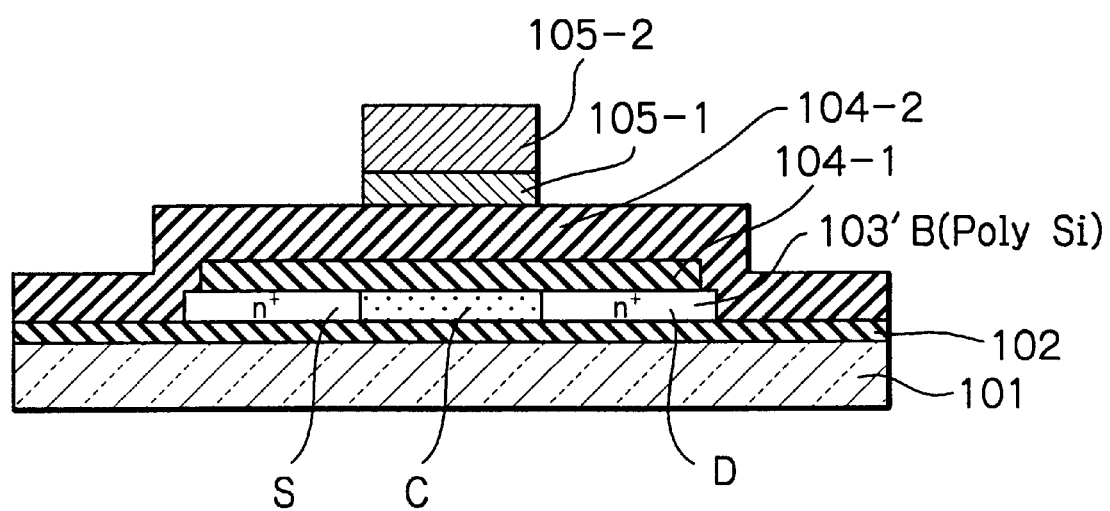
Figure 9B:
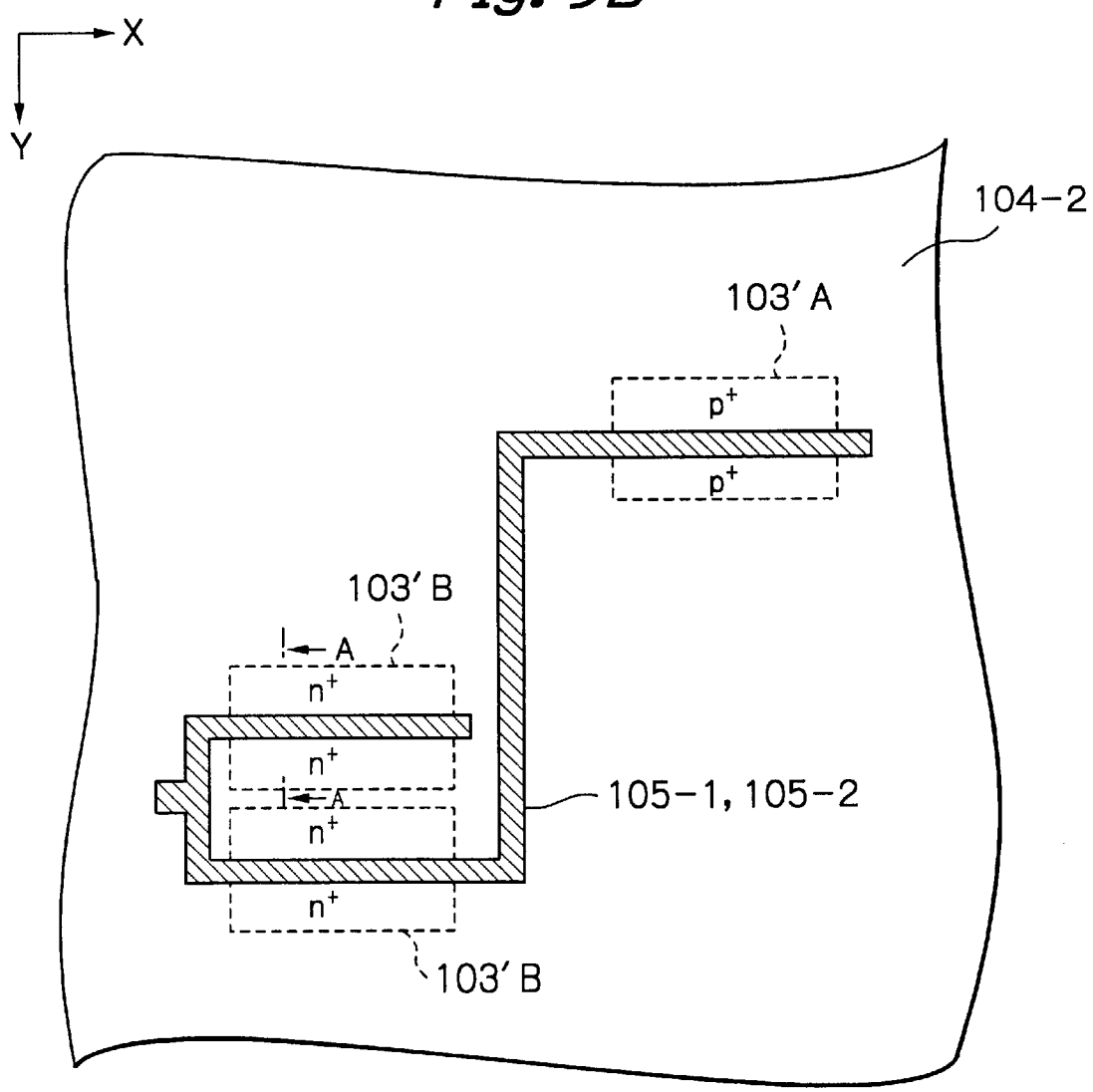

Next, referring to FIGS. 9A and 9B, the glass substrate 101 is again subject to a cleaning and rinsing process to remove contaminants from the surface of the gate insulating layer 104-1 and the like. Then, an about 30 nm thick gate insulating layer 104-2 made of silicon oxide is deposited on the entire surface by a plasma CVD process using silane gas and oxygen gas at a temperature of about 450° C. Then, an about 80 nm thick gate electrode layer 105-1 made of phosphorus-doped polycrystalline silicon is deposited on the gate insulating layer 104-2 by a plasma CVD process or an LPCVD process, and an about 110 nm thick gate electrode layer 105-2 made of tungsten silicide is deposited on the gate electrode layer 105-1 by a sputtering process. Then, the gate electrode layers 105-1 and 105-2 are patterned by a photolithography and etching process. Then, impurity ions are implanted into the polycrystalline silicon islands 103'A and 103'B in self-alignment with the patterned gate electrode layers 105-1 and 105-2. For example, if the impurity ions are of an n-type, source regions S and drain regions D of an n$^+$-type are formed within the polycrystalline silicon islands 103'A and 103'B. On the other hand, if the impurity ions are of a p-type, source regions S and drain regions D of a p$^+$-type are formed within the polycrystalline silicon islands 103'A and 103'B. Note that undoped regions of the polycrystalline silicon islands 103'A and 103'B serve as channel regions C.

Figure 10A:
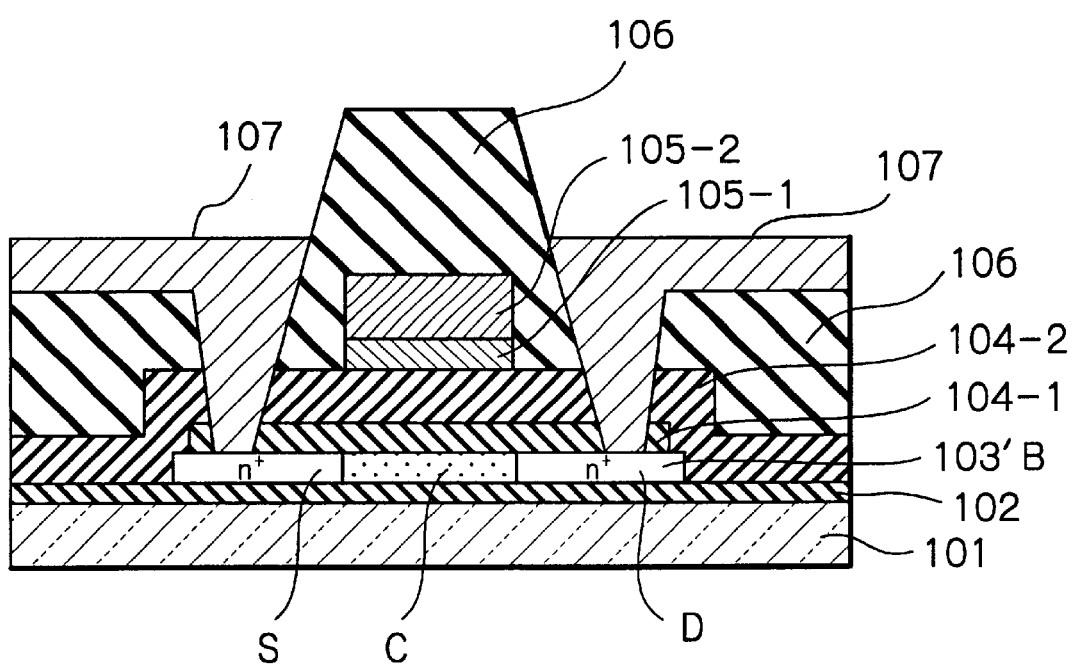
Figure 10B:
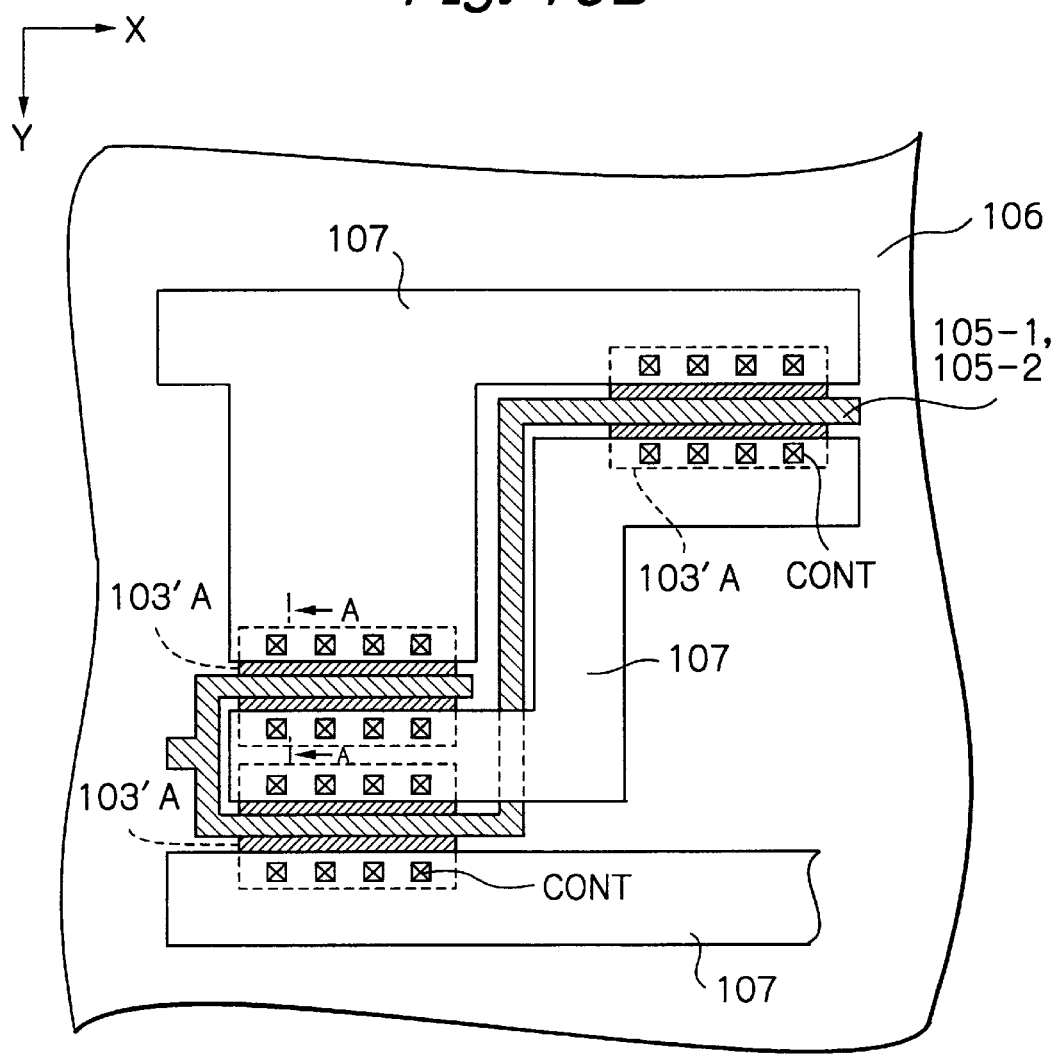

Finally, referring to FIGS. 10A and 10B, a passivation layer 106 made of silicon oxide is deposited on the entire surface by a plasma CVD process using tetra-ethoxysilane (TEOS)gas and oxygen gas. Then, contact holes CONT are perforated in the gate insulating layers 104-1 and 104-2 and the passivation layer 106 by a photolithography and etching process thereupon. Then, a metal layer 107 made of aluminum, aluminum alloy, copper, copper alloy or refractory metal such as tungsten or molybdenum is deposited on the entire surface by a sputtering process or the like, and the metal layer 107 is patterned by a photolithography and etching process.

In FIG. 8B, note that a CMOS inverter is formed by a P-channel TFT and two N-channel TFTs.

In FIGS. 7A and 7B, the irradiation of laser line beams to the amorphous silicon layer 103 can be carried out by using alignment marks. For example, the alignment marks made of tungsten silicide or the like are formed on the substrate covering layer 102 before the irradiation of laser beams to the amorphous silicon layer 103. On the other hand, alignment marks are formed on the amorphous silicon layer 103 simultaneously with the irradiation of laser line beams to the amorphous silicon layer 103. Thereafter, the patterning of the polycrystalline silicon layers 103'A and 103'B into the islands is carried out by using the above-mentioned alignment marks.

In FIG. 11, which illustrates a second embodiment of the present invention, the polycrystalline silicon layers 103'A and 103'B of FIGS. 6A, 6B, . . . , 10A and 10B are formed. In FIG. 11, reference numerals 11', 12', . . . designate customer terminals which are connected via the Internet 2' to a customer information management apparatus 3'.

The customer information management apparatus 3' is constructed by a plurality of manufacturing condition files 31'-1, 31'-2, . . . each corresponding to one of the customer terminals 11', 12', . . . , and recipe files 32'-1, 32'-2, . . . . The customer information management apparatus 3 is connected via a communication line to a manufacturing management apparatus 4', which will be explained later in detail.

The manufacturing management apparatus 4' is connected via a communication line to processing units such as a cleaning and rinsing unit 51', an LPCVD unit 52', crystallizing units 53', 54', 55' and an inspection unit 56'.

Figure 13:
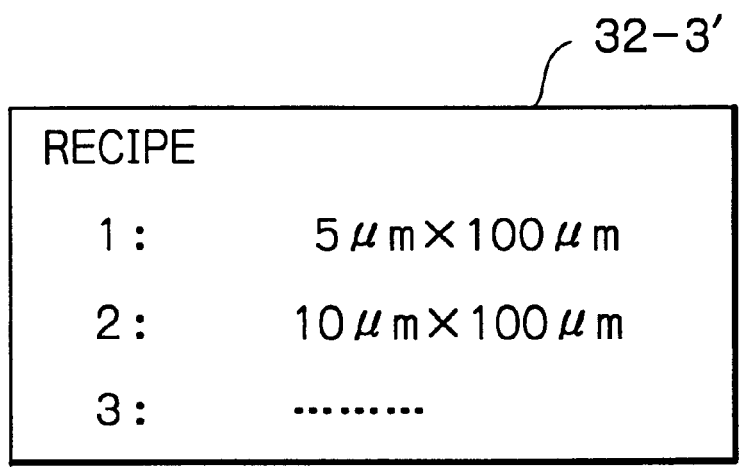
FIG. 13 is a diagram illustrating an example of the recipe of FIG. 12.

In FIG. 12, which illustrates an example of the manufacturing condition file 31'-1 of FIG. 11, the quantity, glass substrate, process specification and inspection specification for customer 1 are stored. Also, recipes of the process specification of FIG. 2 are stored in advance in the recipe files 32'-1, 32'-2, 32'-3, . . . , which correspond to the cleaning and rinsing process, the LPCVD process, the crystallizing process . . . , respectively. An example of the recipe of the crystallizing process of FIG. 12 is illustrated in FIG. 13. Further, a desired time for delivery is stored.

In FIG. 14, which is a detailed block circuit diagram of the manufacturing management apparatus 4' of FIG. 11, the manufacturing management apparatus 4' is constructed by a manufacturing planning section 41' for planning manufacturing of the polycrystalline silicon layers, a unit information section 42' for controlling the units 51', 52', . . . , 55', an inspection information section 43' for controlling the unit 56', a storing section 44' for storing information from the manufacturing planning section 41', the unit information section 42' and the inspection information section 43', an analysis section 45' for analyzing the content of the storing section 44', and a state generating section 45' for generating the manufacturing state of the polycrystalline silicon layers in accordance with the analysis result of the analysis section 45'.

The manufacturing planning section 41' receives the content of the manufacturing condition files 31'-1, 31'-2, . . . , i.e., the name of lots, the designated process unit and the designated inspection units of the manufactured polycrystalline silicon layers, to make a manufacturing plan. For example, an estimated time for entry and an estimated time for delivery are calculated.

The unit information section 42' receives the name of lots and the designated processing units including the inspection unit from the manufacturing planning section 41', to generate the start time and end time of each of the processing units for the lots. The unit information section 42' is connected to the processing units 51', 52', . . . , 55'.

The inspection information section 43' receives the name of lots, the designated inspection units and the inspection specification from the manufacturing planning section 41', to generate the inspection result. The inspection information section 43' is connected to the inspection unit 56'.

The start time and end time of each processing unit and the inspection result as well as the name of lots are stored in the storing section 44'.

The operation of the manufacturing system of FIG. 11 is explained next with reference to FIG. 15.

First, at step 1501, a customer is logged-in by using an ID number and a password to the customer information management apparatus 3'. For example, the customer terminal 11' is connected via the Internet 2' to the customer information management apparatus 3'.

Next, at step 1502, the customer reads its manufacturing condition file 31'-1 and edits the content thereof with reference to the recipe files 32'-1, 32'-2, . . . , thus preparing an order. Note that, as occasion demands, a desired time for delivery can be written into the manufacturing condition file 31'-1. Then, the manufacturing planning section 41' calculates an estimated time for entry and an estimated time for delivery in accordance with the current state of the units 51' to 56'. The estimated entry time and delivery time are stored in the storing section 44', and then, are transmitted by the analysis section 45' and the state generating section 46' to the customer terminal 11'.

Next, at step 1503, the customer decides whether the prepared order is to be proceeded with or to be cancelled. If the prepared order is to be proceeded with, the control proceeds to step 1504. On the other hand, if the prepared order is to be cancelled, the control proceeds directly to step 1508.

At step 1504, the unit information section 42' operates the units 51' to 55', and also, the inspection information section 43' operates the unit 56'. As a result, the start time and end time of each of the units 51' to 55' are transmitted from the unit information section 42' to the storing section 44', and also, the inspection result, such as the thickness or the deviation of laser irradiation is transmitted from the inspection information section 43' to the storing section 44'.

Next, at step 1505, the analysis section 45' and the state generating section 46' are operated. That is, the analysis section 45' compares the start time and end time of each of the units 51' to 55' and the inspection result of the unit 56' with predetermined values supplied from the manufacturing planning section 41', to generate the manufacturing state of the polycrystalline silicon layers, which is transmitted to the customer terminal 11'. If the estimated time for delivery is too delayed, a revised time for delivery is transmitted to the customer terminal 11'. Also, in this case, an alarm signal is transmitted to the customer terminal 11'.

Step 1506 repeats the control at steps 1504 and 1505 until the polycrystalline silicon layers are completed.

At step 1507, the completed glass substrate with the polycrystalline silicon layers are delivered to the customer, which is also informed to the customer terminal 11'.

Thus, the operation of FIG. 15 is completed by step 1508.

As explained hereinabove, according to the present invention, since the manufacturing process is controlled directly by customers, the manufacturing efficiency can be enhanced.

What is claimed is:

1. A system for manufacturing semiconductor devices, comprising:

a plurality of customer terminals;

a customer information management apparatus, connected via a network to said customer terminals, for receiving orders from said customer terminals;

a manufacturing management apparatus, connected between said customer information management apparatus, and processing units and inspection units, for controlling said processing units and said inspection units in accordance with said orders in said customer information management apparatus, each of said orders including a designated quantity of lots, a designated substrate, designated processing units, designated recipes thereof, designated inspection units and designated inspection recipes thereof, the designated recipes and designated inspection recipes being stored in advance in the customer information management apparatus, the designated recipes and designated inspection recipes respectively corresponding to processes of the designated processing units and the designated inspection units, and the designated recipes and designated inspection recipes serving as selection bases for developing the orders.

2. The system as set forth in claim 1, wherein said customer information management apparatus comprises:

a plurality of manufacturing condition files, each corresponding to one of said customer terminals, for storing the designated quantity of lots, the designated substrate, the designated processing units, the designated recipes thereof, the designated inspection units, and the designated inspection recipes; and a plurality of recipe files for storing recipes of said processing units and said inspection units.

3. The system as set forth in claim 1, wherein said manufacturing management apparatus comprises:

a manufacturing planning section for making a manufacturing plan of said semiconductor devices in accordance with the orders in said customer information management apparatus;

a unit information section controlling the designated processing units in accordance with said manufacturing plan to generate a start time and an end time of each of the designated processing units;

an inspection information section for controlling the designated inspection units in accordance with said manufacturing plan to generate inspection result;

a storing section for storing the start time and the end time of each of the designated processing units and the inspection result;

an analysis section for analyzing a content of said storing section; and a state generating section for generating a current state of said semiconductor devices and transmitting the current state to a respective one of said customer terminals.

4. The system as set forth in claim 3, wherein, each of said orders includes a desired time for delivery of said lots, said analysis section calculating an estimated time for delivery of said lots, said state generating section generating an alarm when the estimated time for delivery of said lots is delayed from said desired time for delivery of said lots.

5. The system as set forth in claim 1, wherein said processing units are a cleaning and rinsing unit, a chemical vapor deposition unit, an exposure unit, a developing unit and an etching unit.

6. The system as set forth in claim 1, wherein, each of said semiconductor devices comprises a glass substrate, a polycrystalline silicon layer formed on said glass substrate, and at least one of said processing units comprises a step and repetitive laser apparatus for generating a rectangular laser line beam for converting a part of an amorphous silicon layer into said polycrystalline silicon layer.

7. A system for manufacturing semiconductor devices, comprising:

a customer information management apparatus, capable of being logged-into by customers via a network, for receiving orders from said customers;

a manufacturing management apparatus, connected between said customer information management apparatus, and processing units and inspection units, for controlling said processing units and said inspection units in accordance with said orders in said customer information management apparatus, each of said orders including a designated quantity of lots, a designated substrate, designated processing units, designated recipes thereof, designated inspection units and designated inspection recipes thereof, the designated recipes and designated inspection recipes being stored in advance in the customer information management apparatus, the designated recipes and designated inspection recipes respectively corresponding to processes of the designated processing units and the designated inspection units, and the designated recipes and designated inspection recipes serving as selection bases for developing said orders.

8. The system as set forth in claim 7, wherein said customer information management apparatus comprises:

a plurality of manufacturing condition files, each corresponding to one of plural customer terminals, for storing the designated quantity of lots, the designated substrate, the designated processing units, the designated recipes thereof, the designated inspection units, and the designated inspection recipes; and a plurality of recipe files for storing recipes of said processing units and said inspection units.

9. The system as set forth in claim 7, wherein said manufacturing management apparatus comprises:

a manufacturing planning section for making a manufacturing plan of said semiconductor devices in accordance with the orders in said customer information management apparatus;

a unit information section controlling the designated processing units in accordance with said manufacturing plan to generate a start time and an end time of each of the designated processing units;

an inspection information section for controlling the designated inspection units in accordance with said manufacturing plan to generate inspection result;

a storing section for storing the start time and the end time of each of the designated processing units and the inspection result;

an analysis section for analyzing a content of said storing section; and a state generating section for generating a current state of said semiconductor devices and transmitting the current state to a respective one of plural customer terminals.

10. The system as set forth in claim 9, wherein, each of said orders includes a desired time for delivery of said lots, said analysis section calculating an estimated time for delivery of said lots, and said state generating section generating an alarm when the estimated time for delivery of said lots is delayed from said desired time for delivery of said lots.

11. The system as set forth in claim 7, wherein said processing units are a cleaning and rinsing unit, a chemical vapor deposition unit, an exposure unit, a developing unit and an etching unit.

12. The system as set forth in claim 7, wherein, each of said semiconductor devices comprises a glass substrate, a polycrystalline silicon layer formed on said glass substrate, and at least one of said processing units comprises a step and repetitive laser apparatus for generating a rectangular laser line beam for converting a part of an amorphous silicon layer into said polycrystalline silicon layer.

13. A method for manufacturing semiconductor devices, comprising the steps of:

logging-in by a customer via a network to a customer information management apparatus provided on a manufacturer side, so that a manufacturing condition file specialized for said customer is read and edited by using recipes stored in recipe files, thus preparing an order;

calculating an estimated time for delivery of semiconductor device lots of said order;

determining whether said order is to be proceeded with or cancelled in accordance with said estimated time for delivery of semiconductor device lots;

operating processing units and inspection units to manufacture and inspect said semiconductor device lots only when said order is determined to be proceeded with; and transmitting a start time and an end time of each of said processing units and inspection result of said inspection units via said network to said customer, wherein, the recipes stored in recipe files are stored in advance of the customer log-in and reflect available processes of the processing units and the inspection units, the recipes serving as selection bases for developing the order.

14. The method as set forth in claim 13, wherein said manufacturing condition file storing designated quantity of lots, designated substrate, designated processing units, designated recipes thereof, designated inspection units, and designated inspection recipes.

15. The method as set forth in claim 13, wherein, said order includes a desired time for delivery of said semiconductor device lots, and said method further comprises the steps of:

calculating an estimated time for delivery of said semiconductor device lots; and generating an alarm when the estimated time for delivery of said semiconductor device lots is delayed from said desired time for delivery of said semiconductor device lots.

16. The method as set forth in claim 13, wherein said processing units are a cleaning and rinsing unit, a chemical vapor deposition unit, an exposure unit, a developing unit and an etching unit.

17. The method as set forth in claim 13, wherein, each of said semiconductor devices comprises a glass substrate, a polycrystalline silicon layer formed on said glass substrate, and at least one of said processing units comprises a step and repetitive laser apparatus for generating a rectangular laser line beam for converting a part of an amorphous silicon layer into said polycrystalline silicon layer.

* * * * *